United States Patent [19]

Besesty et al.

[11] Patent Number: 5,912,728

[45] Date of Patent: Jun. 15, 1999

[54] DEVICE FOR PRECISELY MEASURING THE DURATION OF A TIME INTERVAL

[75] Inventors: Pascal Besesty, Vaulnaveys le Huat; Marc Belleville, St Egreve, both of France

[73] Assignee: Commissariat A L'Energie Atomique, Paris, France

[21] Appl. No.: 08/810,212

[22] Filed: Feb. 28, 1997

[30] Foreign Application Priority Data

Mar. 1, 1996 [FR] France .................................. 96 02616

[51] Int. Cl.[6] ............................... G01C 3/08; G02F 8/00
[52] U.S. Cl. .......................................... 356/5.01; 368/113
[58] Field of Search .................... 368/113, 118; 356/5.01

[56] References Cited

U.S. PATENT DOCUMENTS

| | | |
|---|---|---|
| 4,637,733 | 1/1987 | Charles et al. . |
| 4,942,561 | 7/1990 | Ohishi et al. .......................... 368/118 |
| 5,200,933 | 4/1993 | Thornton et al. . |
| 5,495,494 | 2/1996 | Molva et al. . |
| 5,570,326 | 10/1996 | Trystram . |

FOREIGN PATENT DOCUMENTS

| | | |
|---|---|---|
| 0165144 | 1/1987 | European Pat. Off. . |
| 0653824 | 2/1996 | European Pat. Off. . |
| 0632279 | 10/1996 | European Pat. Off. . |

OTHER PUBLICATIONS

AR—Proceedings of the IRE, Jan. 1957, pp. 21–30, Baron, R.G., "The Vernier Time–Measuring Technique".

*Primary Examiner*—Mark Hellner
*Attorney, Agent, or Firm*—Michael N. Meller

[57] ABSTRACT

This invention relates to a device for measuring the duration of a time interval between a start signal (D) and an end signal (F) comprising: a clock (H) supplying pulses with a period T, a digital circuit (2, 3, 4) to carry out a coarse measurement of the number of clock pulses between D and F, an analog circuit (6, 8, 10, 12, 14) to carry out a fine measurement of the time respectively between D and the first (respectively between F and the last) clock pulse which begins after D (respectively before F), this circuit comprising: means (8, 10) of generating N ramps with the same direction, means of sampling at least one the ramps at the instants that D and F occur. Application to a microlaser telemeter.

14 Claims, 5 Drawing Sheets

DEVICE FOR PRECISELY MEASURING THE DURATION OF A TIME INTERVAL

DESCRIPTION

1. Technical Field

This invention relates to a device for measuring the duration of a time interval.

The field of the invention is that of chronometry, the accurate measurement of a period of time, short or infinitely long, between a measurement start signal and a measurement end signal.

This type of problem arises in all devices where an accurate time measurement is necessary over very long durations, in particular, in devices used in the field of laser telemetry.

The invention also relates to a device that allows the determination of distance by means of the measurement of the time taken for a light pulse to make the round trip between a telemeter and a target. The light pulse is emitted by a laser: the invention therefore equally relates to the field of laser telemetry or LIDAR.

It has an application for the measurement of short and medium distance, in the automobile field (for the fine adjustment of anti-collision systems), in the field of measuring dimensions, and in the field of environment perception for robotic devices.

2. State of the Prior Art

Within the field of measuring time with great accuracy, the following methods are required:

either averaging techniques which considerably increase the time for acquisition in relation to the time measured. This type of technique cannot be used in the case where the acquisition time must be limited and furthermore, the averaging is only possible if the measured phenomenon remains stationary for a suitable time in relation to the averaging time.

or to "vernier" type techniques, these techniques relying on counting clock periods for a coarse measurement, and on the determination of a temporal complement by an analog method which gives precision to the measurement. Such a technique is described in the article entitled "The vernier time-measuring technique" by Robert G. Baron (Proceedings of the IRE, January 1957), but this technique extends the measurement time by a not insignificant amount (5 $\mu$s of measurement time for a resolution of 20 ps with 100 Megahertz clocks). This technique therefore restricts the number of measurements possible to well short of the rate at which certain events occur.

or high frequency counting techniques which will be limited by implementation difficulties and the maximum frequency of the counters.

The French patent application FR-2 707 814 entitled "A device for the measurement of the duration of a time interval" describes a method of measuring time that allows the ambiguity in counting clock pulses to be eliminated and takes account of the problems of non-synchronism. This method is not suitable for the measurement of large time intervals, greater than 10 $\mu$s, because of the discharge of a circuit condenser which can introduce a large error over large measurement intervals, notably for medium distance telemetry applications (greater than 1 km).

The document U.S. Pat. No. 5,200,933 describes a device that allows the accurate measurement of a time interval with the aid of a coarse measurement and a fine measurement. The coarse measurement is obtained by counting clock pulses. The fine measurement is obtained by digitising a triangular signal, synchronous with the clock pulse. The two pieces of information are combined in a processing circuit to calculate the duration of the time interval between a start pulse and an end pulse.

These two devices have major disadvantages making them difficult to produce because of the design either of the electronic boards or of the integrated circuits.

First identical gradients for an ascending ramp and a descending ramp cannot be guaranteed, that is to say the discharge time of the condenser is different to the charge time. This is due essentially to the use of a different commutation circuit (for the charge and the discharge) whilst the condenser is common. For example, an N type transistor is used for the charge, and a P type transistor for the discharge.

Furthermore, the joint between the ascending ramp and the descending ramp is not perfect for high frequencies. This is due to the switching between two conditions.

In addition, the constancy of the gradients cannot be guaranteed in relation to the temperature or to the technological parameters, in the case of an integration. For example, the resistance $R_{ds}$ on of a field effect transistor can vary by 20% between two extreme points on a silicon wafer.

Finally, the linearity of the gradients cannot be guaranteed over the whole length for large amplitude dynamics.

The device described in document U.S. Pat. No. 5,200,933 requires in addition, in certain cases, that the calculation of the fine measurement of the start and end time intervals be carried out with different time equations.

3. Description of the Invention

This invention aims to propose a device that at least allows the measurement of time intervals of between 10 $\mu$s and infinity.

A problem to be resolved by the invention is to avoid the use of a double ramp (an ascending ramp and a descending ramp) so as to avoid the disadvantages already explained above, linked to such use.

Hence the invention proposes a device for measuring the duration of a time interval between a start signal (D) and an end signal (F) characterised in that it comprises:

a clock (H) which supplies pulses with a period T, a digital circuit to count the number of pulses from the first clock which are followed by a whole period T and which are included between the start signal (D) and the end signal (F), an analog circuit to determine, on the one hand, the time $t_1$ separating signal (D) and the start of the first pulse of the first clock which begins after (D), and, on the other hand, the time $t_2$ separating the end signal (F) from the end of the last period of the first clock which ends before (F), and is capable of converting the analog data obtained into digital data, this analog circuit comprising means of generating N ramps with the same direction, displaced from one another by a fraction of the period T, means for sampling at least one of the ramps at the instants that the start (D) and end (F) signals of the interval to be measured occur.

This device only makes use of ramps in the same direction, which avoids problems of different gradients between ascending and descending ramps. Similarly, problems of the join between the ascending and descending ramps are avoided.

Furthermore, the calculation of the fine measurement of the time intervals at the start and the end use the same time equation.

According to one particular embodiment, the device according to the invention includes means for generating pulses of period T/N, first and second registers with series-parallel shift, each having, on the one hand a series input connected to the output of the means for generating pulses of period T/N and, on the other hand parallel outputs, N in number, each of these registers being able to supply, on each of its N outputs, signals ($I_1, \ldots, I_5$) of period T, displaced by a period of time T/N with respect to the signals from the neighbouring outputs, and each of the N outputs being connected to a ramp generator.

This device can include means for sampling all the ramps at the instants of the start (D) and the end (F) of the interval of time to be measured, and means for selecting the sampled value which is located in a predetermined portion of one of the ramps.

This permits improvement of the linearity of the device since only one portion of the ramp is selected. Preferably the portion located at the centre of the ramp is selected which is advantageous compared to switching at the top or at the bottom of the ramp. In the latter case, instabilities, switching peaks or problems of over-shoot or non-linearity can occur.

Means can be provided to determine the value of the gradient of the ramps. In this case, there is no problems linked to possible variation of the characteristics of components making up the device, and the linearity of the gradients can be guaranteed over its whole length, for large amplitude dynamics.

The means to determine the gradient of the ramps can notably comprise means for generating a $(N+1)^{th}$ ramp and means for sampling this $(N+1)^{th}$ ramp.

In accordance with another aspect, the invention also relates to a laser telemetry device, operating on the principle of measuring the flight time of a light pulse, characterised in that it includes:

a passively triggered microlaser, means of receiving a light pulse reflected by an object and of detecting the instant of reception of this pulse, means of detecting the instant of emission of a microlaser pulse, a device such as that described above for measuring the time interval separating the instant of emission of a microlaser pulse and the instant of reception of a reflected beam.

Such a telemeter is particularly well suited to the measurement of medium distances (greater than 1 km for example).

The microlaser can notably include a solid active medium, a saturable absorber, an input mirror, an output mirror, the saturable absorber being a thin layer of saturable absorbent material deposited directly onto the solid active medium.

BRIEF DESCRIPTION OF THE FIGURES

The characteristics and advantages of the invention will, in any case, become more apparent in the light of the description that will follow. This description rests on examples of embodiments which are given for purposes of explanation and are non-limitative and which refer to the appended drawings in which.

DETAILED DESCRIPTION OF EMBODIMENTS OF THE INVENTION

In order to measure the duration of a specific time interval, according to the invention, the coarse part of the time interval is measured in a digital way and the fine part in an analog way. The parameters thus acquired are then recombined in order to obtain the result for the duration to be measured. Hence, the time measurement is obtained by bringing together a digital quantity in the form of a number of clock periods counted, and analog quantities obtained by the conversion of time into a voltage amplitude.

Figure 1:
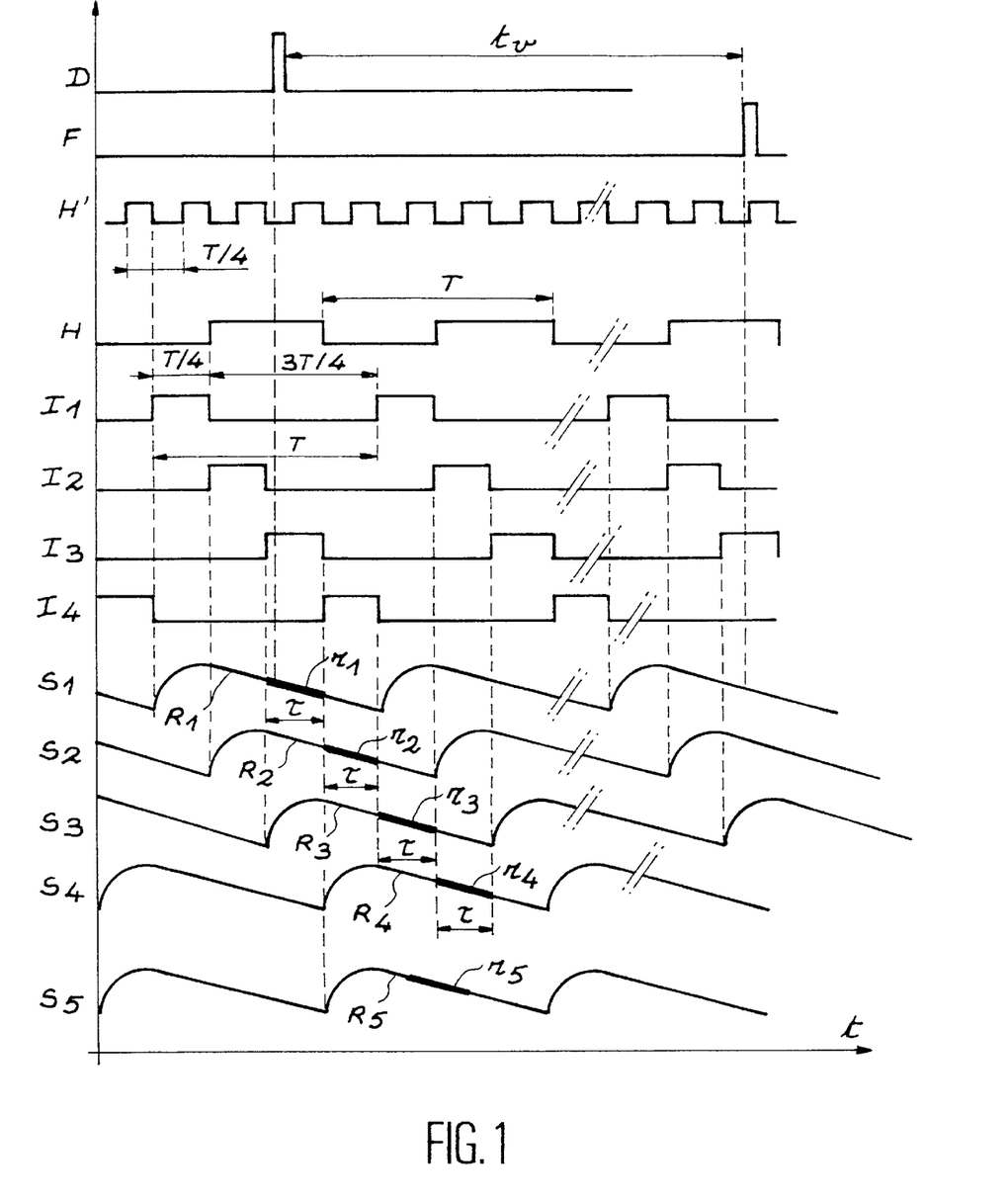
FIG. 1 illustrates the principle of measuring a time interval in accordance with this invention.

This principle is illustrated more clearly with the help of the chronogram in FIG. 1. One is seeking to measure the time interval $t_v$ between a start pulse D and a pulse at the end of the interval to be measured F.

To do so, a base clock H of period T is used. The number of clock pulse n which are followed by a whole period T are counted during the period of time $t_v$. The total time corresponding to the passing of this period of time is equal to nT. Since the clock is not synchronous with the start D and end F signals, it is necessary, in addition, to determine on the one hand, the time $t_1$, which passes between the start signal D and the start of the first clock pulse that begins after D and, on the other hand, the time $t_2$ that passes between the end signal and the end of the last clock period which ends before the signal F. To obtain the duration of the time interval $t_v$, it is then sufficient to add the three measured times: $t_1+nT+t_2$.

To determine $t_1$ and $t_2$, several signals $S_1-S_4$ of period T are used, having at least one linear region $R_1-R_4$, each signal being synchronous with the clock signal. For example, as illustrated in FIG. 1, each signal $S_i$ (i=1–4) is in fact a signal that permits definition of a descending ramp $R_i$, all of the ramps having the same gradient P. Four signals have been shown on the Figure, but it is possible to work with any number of signals N. The signals are displaced with respect to one another by a fraction T/N (T/4 in FIG. 1). The duration of the linear ramps $R_i$ and the displacement of the signals $S_i$ one to another are such that there is a coincidence with a linear portion $R_i$ of one of the signals. Hence, any start signal D and/or end signal F is coincident with a point on a linear portion $R_i$ of one of the signals $S_i$. In FIG. 1, the signal D occurs at an instant for which there is coincidence with a point on each of the ramps $R_1$ and $R_2$ At the instant t, if $a_i$ is the amplitude measured on ramp $R_i$, the time passed since the start of the ramp is: $T-a_iP$.

If the start pulse occurs during ramp $R_i$ then: $t_1=T-a_iP$.

If the end pulse occurs during ramp $R_j$ then: $t_2=T-a_jP$.

$t_1$ and $t_2$ are then digitised, which gives two corresponding values $T_1$ and $T_2$. The duration of the time interval $t_v=n_T+T_1+T_2$ is obtained.

Within each of the linear ramps, the user can specify a portion of the ramp to be applicable, which allows an improvement to the linearity of the gradient used and hence to the measurement: to this end, preferably the portion of the ramp found at its centre is chosen which makes to possible to have a stabilised system (that is to say without any problems of switching peaks, over-shoot or non-linearity) and to escape from distortions at the ends of the ramp. Hence, in the schematic diagram in FIG. 1, the selected portions $r_1$, $r_2$, $r_3$, $r_4$, have a time width π and are located at the centre of each of the ramps $R_1$–$R_4$. This selection corresponds well to the criteria defined above: at any instant, and in particular at the instants of start D and end F, it is possible to be coincident with one or other of the selected parts $r_i$ of the different ramps $R_i$.

Preferably, at the time the start signal D or the end signal F is present, all of the ramps are sampled, the value of the amplitude of each ramp at this instant being stored, and the ramp to be applicable is then determined or selected at this instant. Notably, if within each ramp, a using area $r_i$ has been specified, as in FIG. 1, the selected ramp will be the one whose using area is coincident with the start signal D or the end signal F that is occurring.

So as to be able to specify, in an exact way, the gradient P to be used, it is possible to add a calibration signal $S_c$, for example similar to one of the signals of period T, and to measure the gradient $P_0$ of the linear portion of this calibration signal; this linear portion may be designated calibration ramp $R_c$. Hence, in FIG. 1, a fifth signal $S_5$, identical to the fourth $S_4$, allows a calibration ramp $R_5$ to be defined. Just as for the other ramps, it is possible to select, within the calibration ramp, a central area $r_c$ (or $r_5$), called the calibration area. The value of the gradient of this area of the ramp is determined by sampling two or several characteristic points on the ramp and it is this value $P_0$ which is then used to carry out the calculations of $t_1$, $t_2$ and $t_v$. This specification of the ramp, simultaneous with the measurement makes it possible to avoid any drift, due for example to a modification of the values of components brought into play, notably in the event of variation of external conditions, for example, temperature conditions. This measurement can be carried out for any determination of the duration $t_v$ between signals D and F; in an alternative way, it may only be carried out at the time the device is switched on.

In particular, in the case where the drifting due to temperature is taken into account, calibration will be carried out at the time of switching on and will not be required again during the entire life of the component. The information arising from the calibration is then stored in a memory and is called on to correct measurements.

Thanks to the calibration, the gradient of the ramps or of their areas used can be known and determined with great accuracy, which allows the determination and the dynamic of the measurement to be improved.

Thanks to this method, the time equation that is made use of is always the same one, and is strictly identical from one ramp to another ($t_v = nT + t_1 + t_2$)

The use of ramps with the same direction and of the same gradient makes it possible to avoid problems that are encountered when using ramps that are alternately ascending and descending (ramps that are not necessarily identical, imperfect joins between ascending and descending ramps).

The different signals $S_1$–$S_4$ can be triggered by pulses $I_1$–$I_4$, themselves obtained from pulses from clock H' whose period is a whole number fraction (T/N) of the period T of pulses from clock H. The accuracy of these measurements can be varied by causing the frequency of the pulses from clock H' to vary.

Figure 2:
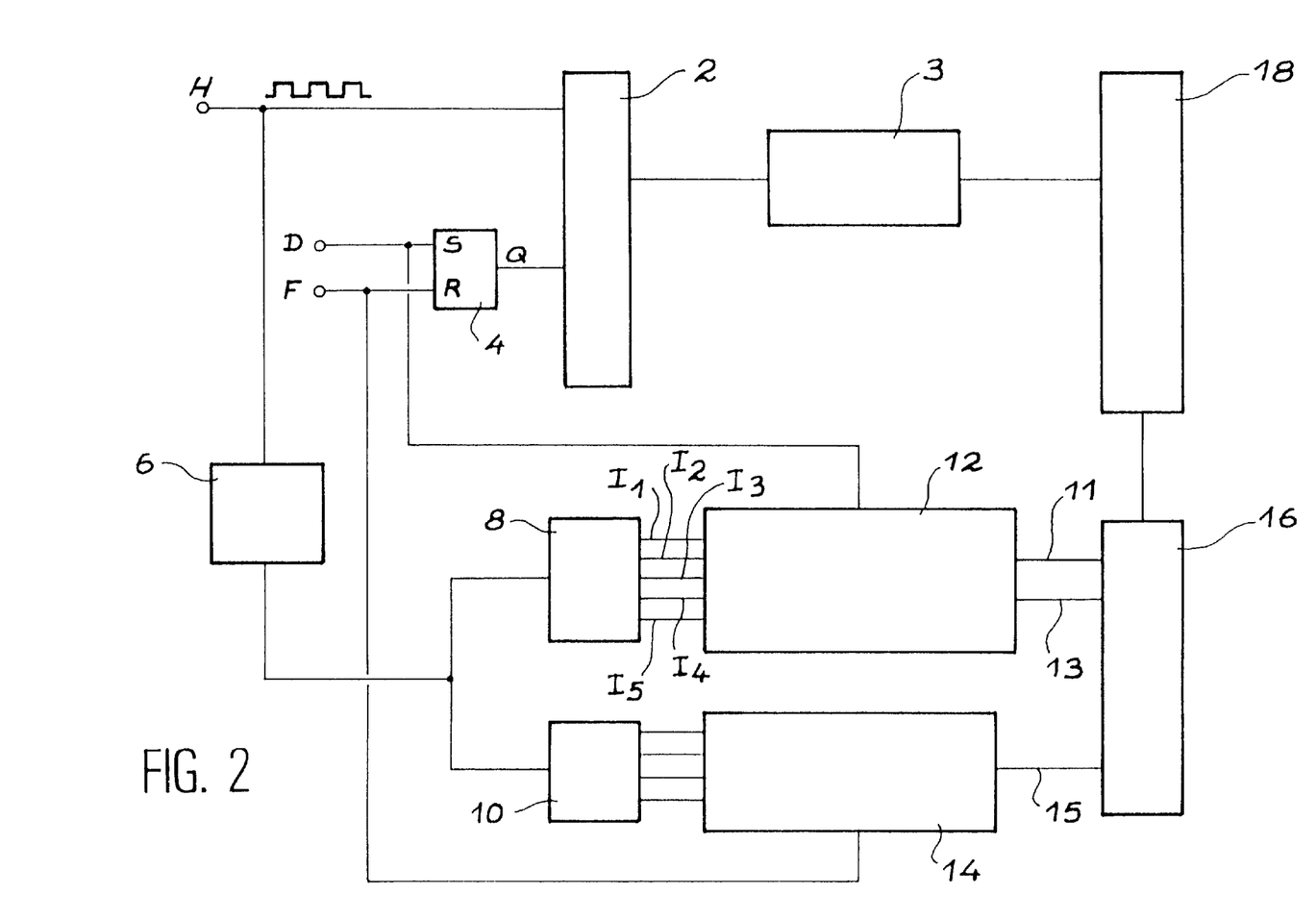
FIG. 2 is a schematic diagram of a device for the implementation of the invention.

A device for the implementation of the invention is shown in FIG. 2. A clock H supplies pulses of period T to one of the inputs of a AND gate designated by reference number 2. This clock H can be produced from a quartz oscillator, operating for example at a frequency of 50 MHz. The other input of the AND gate receives a signal from the output Q of an RS flip-flop designated by reference number 4, on the input S of which the start signal D is received, whilst the input R is controlled by the end signal F. The assembly made up by the AND gate, the flip-flop 4 and the clock H forms a digital measuring circuit that makes it possible to obtain a coarse value of the time interval to be measured. This value is equal to nT where n is the number of T clock periods that passed between the start signal D and the end signal F. It is counted in counter 3, then transmitted in the form of coarse data of eight bits, to a processing circuit 18.

Figure 3:
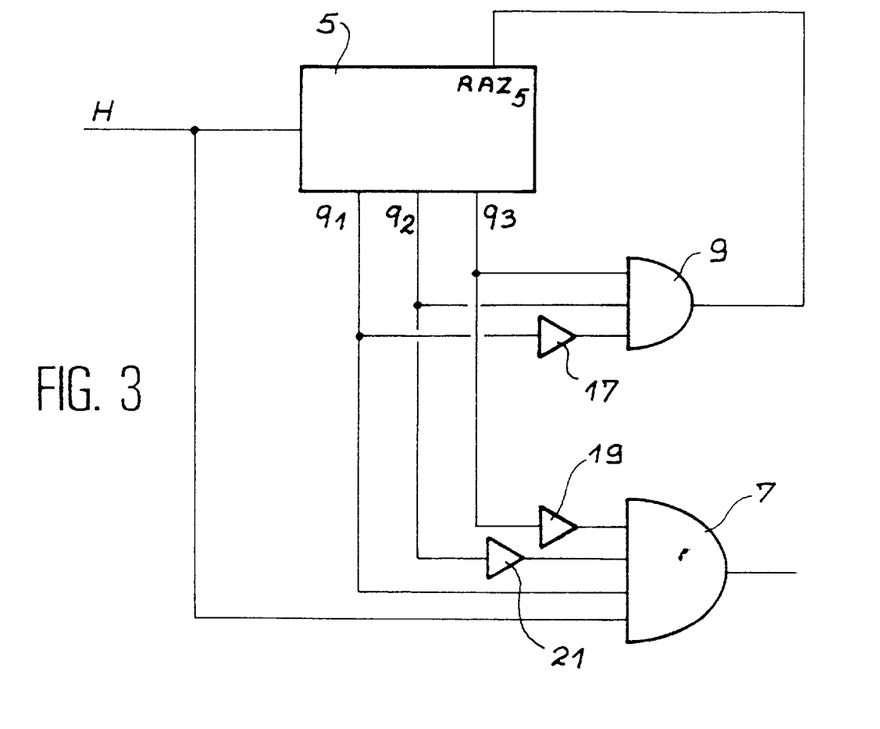
FIG. 3 is a schematic diagram of a period divider circuit, FIG. 4 represent in greater detail a part of a device for the implementation of the invention.

In parallel, a divider circuit of period 6 allows the supply of clock pulses with a period T/N. An example of a divider circuit is illustrated in FIG. 3 for N=6

The clock pulses are sent to a synchronous 4 bit or 3 bit counter designated by reference number 5, and to a AND gate 7. Two outputs $q_2$ and $q_3$ are sent as input to AND gate 9 whilst the third output signal $q_1$ is inverted by an inverter 17. The two outputs $q_2$ and $q_3$ are inverted by inverters 19, 21 and sent as input to gate 7 as well as the signal $q_1$.

The output of gate 9 is looped onto the reset $RAZ_5$ of counter 5. The output from gate 7 supplies the clock pulses with a period T/6.

For any value N, it suffices to choose a synchronous counter with a greater number of bits and to use the appropriate logic combination. The pulses of period T/N thereby obtained supply the inputs of two registers 8, 10 with series-parallel displacement. At the output of register 8, N (here:four) pulses $I_1$–$I_4$ of width T/N are obtained which repeat with a period T (as in FIG. 1). A fifth channel supplies pulses $I_5$ for the calibration of the gradient of the ramps. In the case of four ramps $I_1$–$I_4$, and for a clock H supplying pulses at 50 MHz, on each channel i (i=1,4) signals $I_i$ are obtained with a square wave form of period T (20 ns), and of duration T/N (=T/4=5 ns). The pulses $I_1$–$I_5$ are transmitted to the input of a device 12 which will be described in a more detailed manner with the help of FIG. 4. Each of the pulses $I_1$–$I_5$ causes a ramp generator 121, 122, 123, 124, 125 to start.

Figure 5:
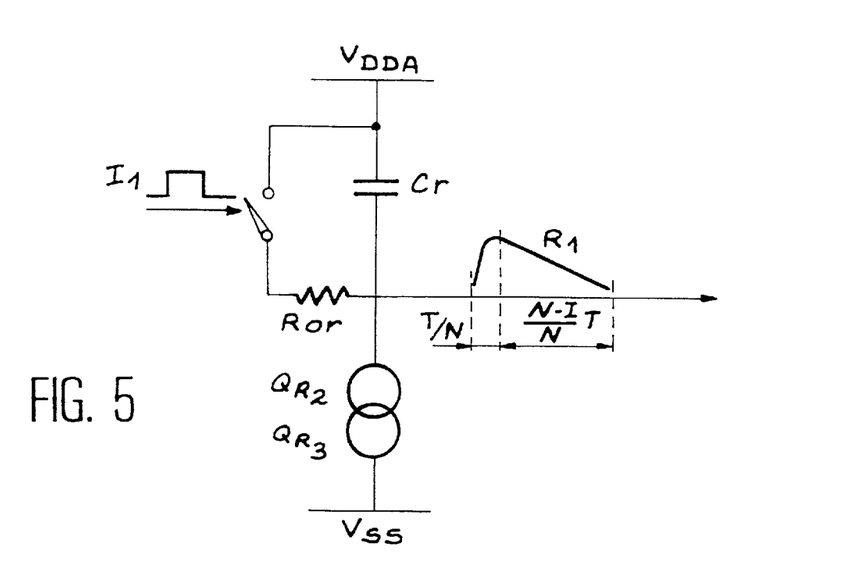
FIG. 5 represents a ramp generator.

Such a generator comprises, as shown in FIG. 5, a condenser $C_r$ and a current generator created by two transistors $Q_{R2}$ and $Q_{R3}$ When pulse $I_1$, arrives, condenser $C_r$ is charged during the period of time T/N (5 ns in the example above). During the period of time $$\frac{N-1}{N}T,$$

that is the discharge phase, the voltage at the condenser terminals decreases in a linear manner. A descending ramp is thus obtained during the period of time $$\frac{N-1}{N}T.$$

Each of the ramp generators 121, 122, . . . , 125 is constituted in the manner described in FIG. 5.

The command signals $I_1$–$I_4$ for the first four ramps being displaced with respect to one another by a quarter of a period (or by a period of time T/N, for the general case), four ramps are obtained (or N ramps), each being displaced with respect to neighbouring ramps, by a period of time T/N. Because of this displacement, the four ramps are able to cover the whole period T. When the start signal D is present, the four ramps $R_1-R_4$ are sampled by the switches 131–134 and the information is stored, for each ramp, by a condenser $C_1-C_4$. A selection circuit 120 subsequently makes it possible to choose the value sampled from the ramp, within the useful portion, which coincides with the signal D. The principle of the selection consists of carrying out a AND logic combining operation between the signal D (or F) and each signal $I_1$, $I_2$, $I_3$, $I_4$. The useful portion of each ramp $R_i$ coincides with one of these signals, but not with the signal $I_i$ with the same suffix. Hence, in FIG. 1, it can be seen that $r_1$ coincides with $I_3$, $r_2$ with $I_4$, $r_3$ with $I_1$ and $r_4$ with $I_2$. Consequently, for example for $r_1$, a selection signal $SL_1(=I_3)$ can be specified that coincides with $r_1$. Similarly, for $r_i$, a selection signal $SL_i$ is specified that coincides with $r_i$. Hence, the AND combining mentioned above amounts to a AND logic combination between D (or F) and each selection signal $Sl_i$. The result retained is the value of the ramp $r_i$ whose selection signal $SL_i$ gives 1 in AND logic combination with signal D (or F).

Figure 4:
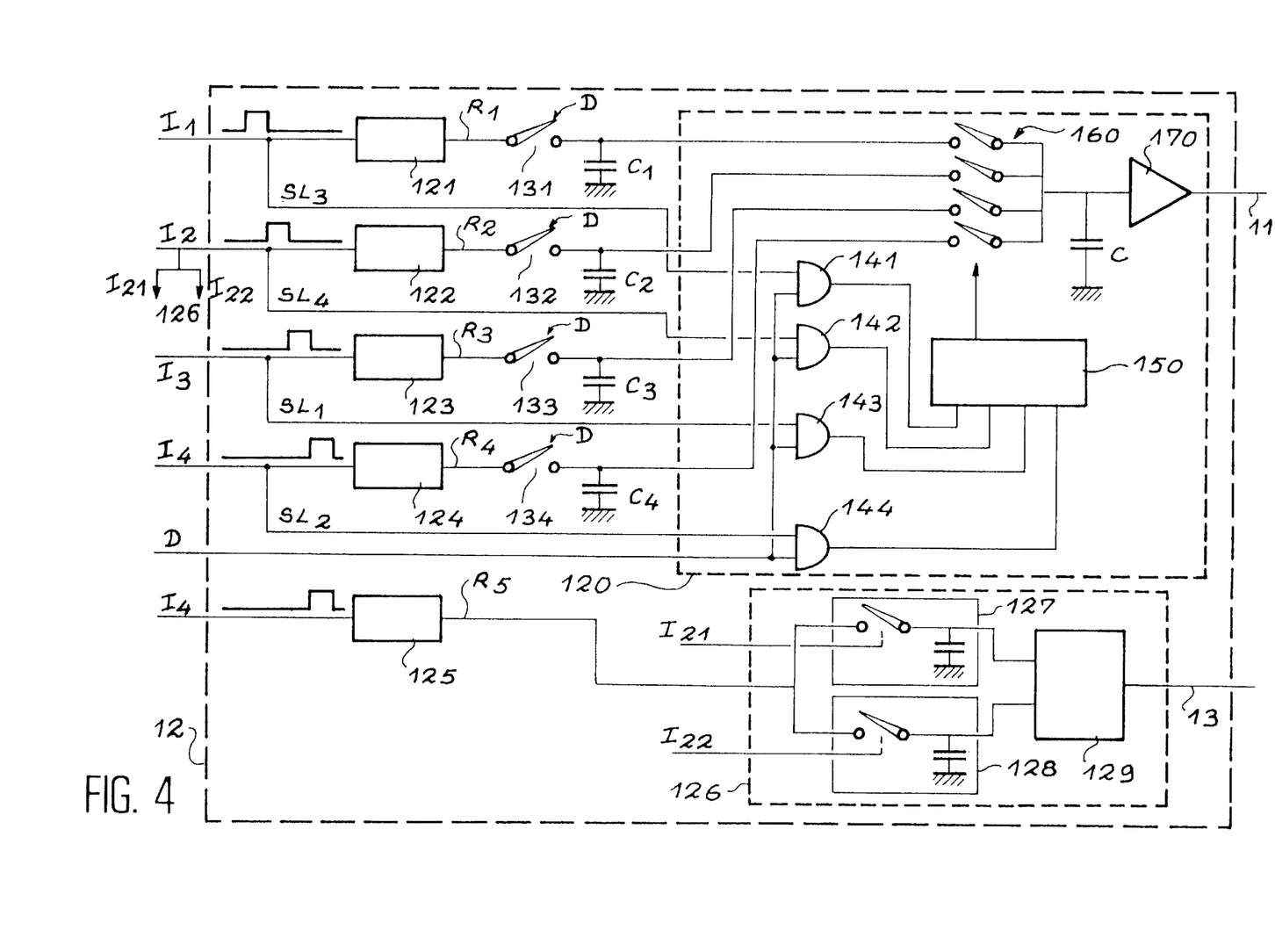

For any value of N, the same principle is to be used: for each ramp $R_i$ and its corresponding useful linear portion, a selection signal $SL_i$ is specified, and the AND logic combination of $SL_i$ and D (or F) is carried out. A circuit 120 to carry out this selection is illustrated in FIG. 4. Each signal $I_i$ allows the formation of a selection signal $SL_i$ which is combined with signal D by a AND logic gate 141, 142, 143, 144. A command circuit 150 for switch 160 allows the selection of information stored in condenser $C_i$ for which the selection signal $SL_i$ coincides with signal D (or F) . An amplifier 170 supplies, on an output channel 11, the sampling signal of the selected ramp.

The last channel in FIG. 4 is the calibration channel. Signal $I_5$ starts a ramp generator 125 identical to the one described in FIG. 5. The ramp obtained is sampled by a device 126, which operates on the following principle. First the signal $I_i$ can be identified, with which the central calibration area $r_5$ approximately coincides. Hence, in FIG. 1, $r_5$ coincides with a square wave of signal $I_2$. At the instants where the leading and trailing edges of $I_2$ are created, sampling takes place, the time period separating the two instants being given by the period of time $\pi_1=T/N$ of a square wave of $I_2$. Two signals $I_{21}$ and $I_{22}$ are triggered by these leading and trailing edges (for example with the help of a flip-flop D), these signals each commanding the opening of a tracking and hold circuit 127, 128 (see FIG. 4). A circuit 129 can subsequently calculate the value of the gradient $\pi_1/(V_1-V_2)$. The digitised value is supplied at output 13.

On the channel corresponding to end pulse F, the device 10 is similar to device 8. If a calibration channel is provided in means 8 and 12, device 10 does not need to incorporate such a channel. In a reciprocal manner, the calibration channel can be provided in device 10. Likewise, means 14 are similar to means 12, the sampling of the ramps being carried out at the moment the end pulse F arrives.

The values corresponding respectively to the amplitudes of the ramps, retained at the instants of the start D and the end F of the time interval to be measured, and the values sampled on the calibration channel, are then transmitted via channels 11, 15, 13 to a storage device 16, then to a processing circuit 18 which calculates the duration $t_V$ of the time interval to be measured.

Figure 6:
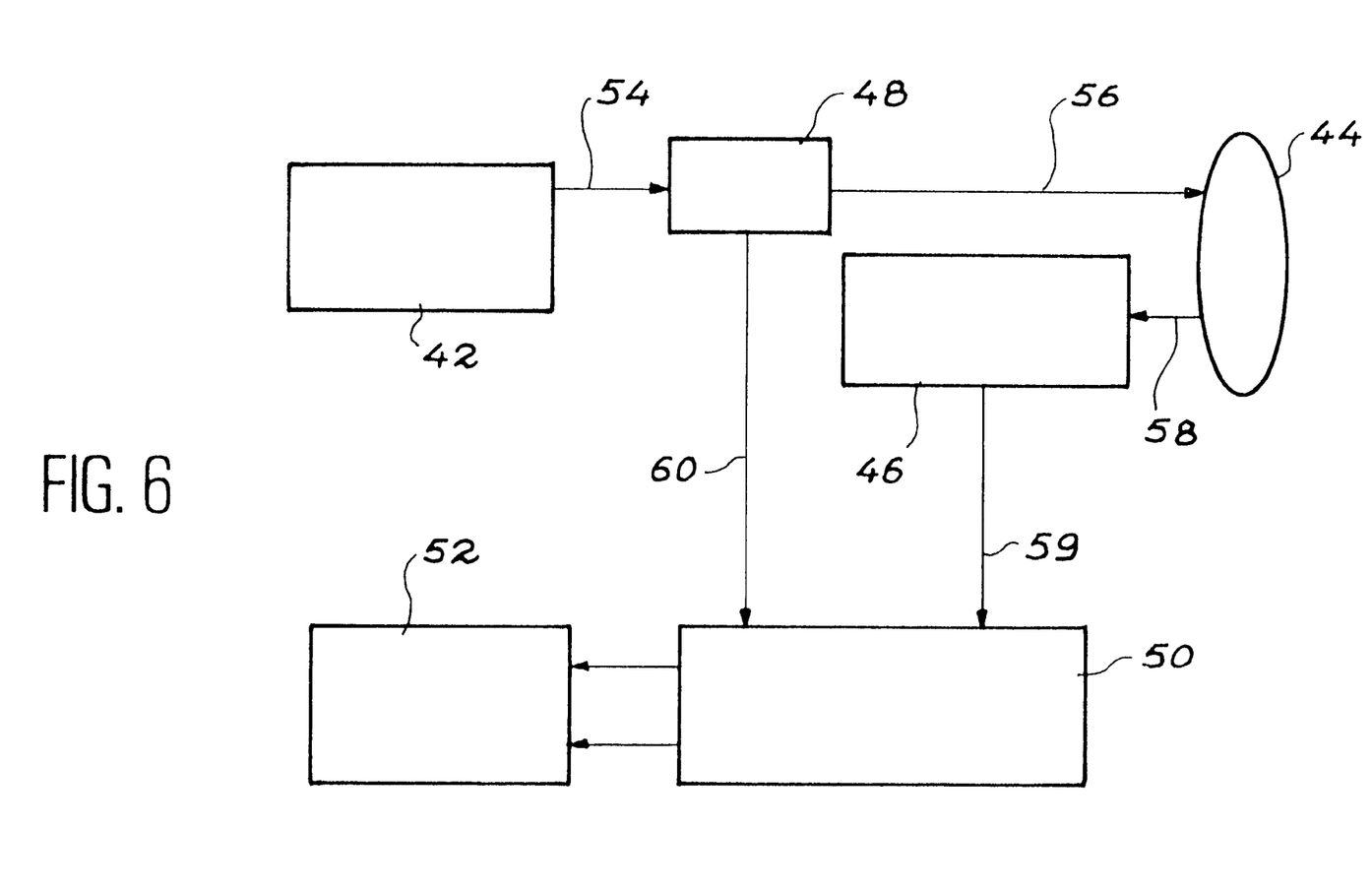
FIG. 6 represents a microlaser telemeter according to the invention.

The device described above can be incorporated in a telemeter, as described in FIG. 6. A passively triggered microlaser 42 sends a light beam 54 in the direction of an object whose desired position is to be determined. A beam 58 reflected by this object is directed to optical means 46 for receiving a light beam such as, for example, a beam separator combined with a receiving lens. The beam 59 obtained at the output from the receiving means 46 for the reflected beam 58 is directed to a detection circuit 50 comprising, for example, a photodetector component which will supply an electric pulse marking the end of the interval that must be measured in order to determine the flight time of the beam. In addition, this circuit includes an amplifying chain (made up of amplifiers), which supplies to a comparator stage an end signal for the time interval to be measured. This signal is transmitted to the time measuring device 52, which is, in fact a device for measuring a time interval such as has been described above. Furthermore, the telemeter also comprises means for detecting the instant a pulse is emitted from the microlaser. These means can comprise, for example, a device 48 for sampling a part 60 of the luminous flux of the beam 54 emitted by the microlaser 42, for example a separating blade.

The microlaser 42 is preferably a passively triggered microlaser, whose cavity comprises a solid active medium, a saturable absorber, an input mirror and an output mirror, the saturable absorber being a thin layer of saturable absorbent material directly deposited on the solid active medium. Such a microlaser and its method of production are described in the document EP-0 653 824. Consequently, within the background of this invention and conforming to the teaching of this prior document, the thin layer of saturable absorber can be made of:

an organic colouring agent in solution in a polymer solvent (the organic colouring agent can be chosen from bis (4-diethylaminodithiobenzyl) nickel or bis (4-dimethylaminodithiobenzyl) nickel, the solvent being a solution of polymethylmethacrylate (PMMA), polyvinyl alcohol or polyvinyl acetate or polystyrene, or a thin layer that has been deposited by liquid phase epitaxy; this can be a thin layer composed of a base material identical to that of the solid active medium, and doped with $Cr^{4+}$or $Er^{3+}$ ions.

In the first case, (organic colouring agent and polymer solvent) the thin layer can be formed by direct deposition onto one of the faces of the material making up the solid active medium, according to the trammel technique. All the other details relating to the production of this saturable absorber in the form of a thin layer, and the creation of a microlaser, are given in document EP-0 653 824.

Depositing the saturable absorber in the form of a thin layer, directly onto the active material of the microlaser offers several advantages:

the Q-switched microlaser is produced in the form of a stack of layers, which makes it possible to keep the possibility of collective manufacturing and which does not call into question the simplicity and the collective manufacturing methods for microlasers, such as have been developed for continuous lasers, the Q-switched microlaser obtained is monolithic, automatically aligned (it requires no optical adjustment at all) and cannot be put out of adjustment; consequently this structure does not require any bonding operation or any complex operation for aligning the microlaser cavity. Finally, regarding doped lasers, the active medium is separated from the saturable absorber and the thickness' and the concentrations of the ions in; the two media can be adjusted independently furthermore, thanks to this separation, Q-switched lasers can be produced where the same ion can be used as an active ion and as a saturable absorber, with different concentrations.

In the case of the telemeter laser above, the start instant for the time measurement is given by the light pulse coming from the microlaser. The period for reception of the light pulse is linked to the triggering of the microlaser, which is asynchronous with respect to the clock for the chronometry. The instant of the end of the measurement is linked to the return of this same pulse, which has travelled a distance which is double the distance between the microlaser 42 and the target 44. The signal coming from the detection system is also asynchronous with respect to the clock for the chronometry. The applications which are envisaged for this type of telemeter necessitate an accurate chronometric device, with time discrimination of a few picoseconds, in order to measure a few microseconds.

The time interval measuring device of the type which has been described above is particularly well suited to microlaser telemetry application since it offers constant accuracy whatever the duration of the time interval. Furthermore, this device does not demand preliminary initialisation to enable a measurement to be made since the ramps are recursive and avoid start up conditions in the circuits.

The microlaser telemeter described above can be used in the automobile industry to create anti-collision devices or devices for detecting obstacles.

We claim:

1. A device for measuring the duration of a time interval between a start signal (D) and an end signal (F) comprising:

a clock (H) which supplies pulses with a period (T), a digital circuit for counting the number of pulses from said clock which are followed by a whole period T and which are included between the start signal (D), and the end signal (F), an analog circuit for determining the time $t_1$ separating signal (D) and the start of the first pulse of said clock which begins after (D), and the time $t_2$ separating the end signal (F) from the end of the last period of a pulse from said clock which ends before (F), and for converting the analog data obtained into digital data, said analog circuit further comprising, means for generating N ramps ($R_1$–$R_4$) with the same direction, displaced from one another by a fraction of the period T, and means ($C_1$–$C_4$) for sampling at least one of said ramps at the respective times of occurrence of the start (D) and end (F) signals of the interval to be measured.

2. A device according to claim 1, further comprising means for generating pulses of period T/N, first and second registers with series-parallel shift, each of said registers having a series input connected to the output of said means for generating pulses of period T/N and N parallel outputs each of said registers being adapted to supply, on each of its N outputs, signals ($I_1$ . . . $I_5$) of period T, displaced by a period of time T/N with respect to the signals from the adjacent outputs, and each of the N outputs being connected to a ramp generator.

3. A device according to claim 1, comprising means ($C_1$–$C_4$) for carrying out a sampling of all the ramps at the respective times of occurrence of the start (D) and the end (F) of the interval of time to be measured, and means for selecting the sampled value which is located in a predetermined portion of one of the ramps.

4. A device according to claim 3, wherein said means for selecting the sampled value comprises means for determining the coincidence of a selection signal (SL) from each ramp with the time of occurrence of said start (D) and end (F) of the interval to be measured.

5. A device according to claim 1, further comprising means for determining the value of the slope of the ramps.

6. A device according to claim 5, wherein said means for determining the slope of the ramps comprises means for generating a $(N+1)_{th}$ ramp ($R_5$) and means for sampling this $(N+1)_{th}$ ramp.

7. A laser telemetry device, operating on the principle of measuring the flight time of a light pulse, said device comprising:

a passively triggered microlaser, means for receiving a light pulse reflected by an object and for detecting the time of reception of this pulse, means for detecting the time of emission of a microlaser pulse, and a device as defined in claim 1 for measuring the time interval separating said time of emission of said microlaser pulse and said time of reception of said pulse.

8. A device according to claim 7 wherein said microlaser comprises a solid active medium, a saturable absorber, an input mirror, an output mirror, said saturable absorber being a thin layer of saturable absorbent material deposited directly onto said solid active medium.

9. A device according to claim 2, comprising means ($C_1$–$C_4$) for carrying out a sampling of all the ramps at the respective times of occurrence of the start (D) and the end (F) of the interval of time to be measured, and means for selecting the sampled value which is located in a predetermined portion of one of the ramps.

10. A device according to claim 9, wherein said means for selecting the sampled value comprises means for determining the coincidence of a selection signal ($SL_1$) from each ramp with the time of occurrence of the start (D) and end (F) of the interval to be measured.

11. A device according to claim 2, further comprising, means for determining the value of the slope of the ramps.

12. A device according to claim 11, wherein said means for determining the slope of the ramps comprises means for generating a $(N+1)^{th}$ ramp ($R_5$) and means for sampling this $(N+1)^{th}$ ramp.

13. A laser telemetry device, operating on the principle of measuring the flight time of a light pulse, said device comprising:

a passively triggered microlaser, means for receiving a light pulse reflected by an object and for detecting the time of reception of this pulse, means for detecting the time of emission of a microlaser pulse, and a device as defined in claim 2 for measuring the time interval separating said time of emission of said microlaser pulse and said time of reception of said pulse.

14. A device according to Claim 13 wherein said microlaser comprises a solid active medium, a saturable absorber, an input mirror, an output mirror, said saturable absorber being a thin layer of saturable absorbent material deposited directly onto said solid active medium.

* * * * *